(12) United States Patent
Walker (10) Patent No.: US 8,194,324 B2
(45) Date of Patent: Jun. 5, 2012

(54) FRESNEL LENSES

(75) Inventor: Nicholas Simon Walker, Swindon (GB)

(73) Assignee: Microsharp Corporation Limited, Watchfield, Swindon (GB)

( * ) Notice: Subject to any disclaimer, the term of this patent is extended or adjusted under 35 U.S.C. 154(b) by 170 days.

(21) Appl. No.: 12/665,923

(22) PCT Filed: Jun. 23, 2008

(86) PCT No.: PCT/GB2008/002144
§ 371 (c)(1), (2), (4) Date: Mar. 3, 2010

(87) PCT Pub. No.: WO2009/001059
PCT Pub. Date: Dec. 31, 2008

(65) Prior Publication Data
US 2010/0177406 A1 Jul. 15, 2010

(30) Foreign Application Priority Data

Jun. 28, 2007 (GB) .................................. 0712604.8
Apr. 28, 2008 (GB) .................................. 0807711.7

(51) Int. Cl.
*G02B 27/10* (2006.01)
*F24J 2/08* (2006.01)

(52) U.S. Cl. ........................................ 359/625; 126/698

(58) Field of Classification Search ................. 126/698; 136/246; 264/2.1, 2.5, 2.7, 224; 359/625, 359/742, 743
See application file for complete search history.

(56) References Cited

U.S. PATENT DOCUMENTS

| | | | | |
|---|---|---|---|---|
| 4,069,812 A | * | 1/1978 | O'Neill | 136/246 |
| 4,848,319 A | * | 7/1989 | Appeldorn | 126/700 |
| 6,031,179 A | | 2/2000 | O'Neill | |
| 6,075,200 A | | 6/2000 | O'Neill | |

FOREIGN PATENT DOCUMENTS

FR 2 465 968 A 3/1981
GB 2 105 838 A 3/1983

* cited by examiner

*Primary Examiner* — David N Spector
(74) *Attorney, Agent, or Firm* — Vincent K. Gustafson; Jenkins, Wilson, Taylor & Hunt, P.A.

(57) ABSTRACT

A solar concentrator comprises a curved linear Fresnel lens (16) which has a plurality of prismatic features (10, 12, 14). The prismatic features are arranged into at least two segments, in each segment the prismatic features have a common apex angle, the common apex angle differing between adjacent segments. A method of manufacturing a mold (2) for producing a Fresnel lens optical film (16) is disclosed. The method comprises rotating a mold blank, and forming a plurality of different prismatic features (10, 12, 14) on the mold blank by repeatedly advancing a cutting tool (4) onto and then withdrawing the tool away from the surface of the mold blank.

31 Claims, 7 Drawing Sheets

FRESNEL LENSES

CROSS-REFERENCE TO RELATED APPLICATIONS

This application is a U.S. national phase under the provisions of 35 U.S.C. §371 of International Application No. PCT/GB08/02144 filed on Jun. 23, 2008, which in turn claims priority of Great Britain Patent Application No. 0712604.8 filed on Jun. 28, 2007 and Great Britain Patent Application No. 0807711.7 filed on Apr. 28, 2008. The disclosures of such international patent application and Great Britain patent applications are hereby incorporated by reference herein in their respective entireties, for all purposes.

This invention relates to lens arrangements such as Fresnel-type lenses, to optical films on which they are formed and to moulds for making such films. It relates in particular, although not exclusively, to the use of such lenses in solar concentrators.

Solar concentrators are optical systems which focus light from a relatively wide area of direct sun illumination into a reduced area in which an energy transducer device (for example a photovoltaic cell) is located, thereby allowing a smaller transducer to be used and so reducing the cost of solar power systems, which are typically dominated by the price of the energy transducer.

Such solar concentrators can be made from Fresnel lenses. Normally such lenses have prismatic features which are large (of the order of millimeters or fractions of a millimeter). This requires that the structures are cast in single pieces of acrylic plastic using a planar mould and a batch processing method which means that they are relatively costly to manufacture.

When viewed from a first aspect the invention provides a solar concentrator comprising a curved linear Fresnel lens comprising a plurality of prismatic features, said prismatic features being arranged into at least two segments, wherein in each segment said prismatic features have a common apex angle, the common apex angle differing between adjacent segments.

The invention also extends to an optical concentrator film comprising a plurality of prismatic features together forming a lens arrangement such as a Fresnel lens when the film is curved, said prismatic features being arranged into at least two segments, wherein in each segment said prismatic features have a common apex angle, the common apex angle differing between adjacent segments. The prismatic features are preferably adapted to form a lens arrangement when the film is curved.

In at least its preferred embodiments the invention allows a solar concentrator to be made with a curved linear Fresnel lens made from an optical film which can be produced in a continuous drum moulding process. This gives a significant cost reduction over prior art batch moulding processes.

The invention also extends to an optical film comprising a plurality of prismatic features together forming a Fresnel lens when the film is curved, said prismatic features being arranged into at least two segments, wherein in each segment said prismatic features have a common apex angle, the common apex angle differing between adjacent segments.

Large area, transparent polymer films which manipulate the light passing through them are used in a wide variety of applications, from optical effect gift wrapping paper to backlight brightness enhancement in flat panel liquid crystal displays (LCDs). One such type of film is surface relief optical film. These are films where raised transparent structures, such as micro-prisms or micro-lenses, are present on the film which manipulate the direction and spread of light traversing the film. It is possible to make micro-optical structures with a high accuracy and, due to the large film production widths and rapid production speeds, the optical film is relatively low cost.

Films in accordance with at least preferred embodiments of the invention therefore offer viable, low cost alternatives to precision cast plastic optics, which are produced in moulds using a batch production process.

Optical films are generally manufactured by using a moulding process to form the necessary features, whether they are impressed on the film by hot embossing, casting or other techniques. Currently there is no general purpose method for making arbitrary precision micro-optical features with optical surfaces (e.g. those having an RMS smoothness <8 nanometers) on a mould. A variety of production methods exist and each is capable of producing some types of structure and not others. Techniques include: diamond engraving, laser ablation, milling, electrodischarge engraving and etching. Diamond engraving can be either single point diamond turning or diamond surface contouring. The tool is moved relative to the surface using either fly cutting (in which the tool is rotated), scribing (in which the tool is moved in a line) or by moving the surface, e.g. using a lathe. In laser ablation surfaces can be sculpted by removing parts with using a laser. Complex surface features can be created if the total laser light is controlled to micron accuracy, using micro-laser motion control or masks. Milling involves using a small drill bit raised and lowered over the surface.

Linear Fresnel lenses concentrate light to a central stripe—this is in contrast to full 3D lenses which concentrate light to a point or area. The moulding drums for linear prismatic lenses are easier to make than for full 3D Fresnel lenses since the prismatic structure is extended in one direction and micro-precision lathe machines, where the drum is rotated around an axis (the C axis) and the cutting tool moved along the drum in only one direction (the X axis) are able to manufacture such casting drums using a diamond tool. The approach can either use single point diamond turning (where the structure is directly formed matching the shape of the diamond tool since the tool is positioned and then pushed into the surface) or diamond contouring (where a structure is shaped by the trajectory of a smaller tool moving in and out as it traverses the drum).

Solar energy is the use of sunlight to provide an energy source. Energy transducers convert sunlight into a form of energy that can be transmitted or stored. Such energy transducers include photovoltaic cells which convert light into electric power; solar heating, in which sunlight (infrared and visible light) is converted into heat, for example by raising the temperature of water or some other fluid; solar hydrogen production; and internal day-lighting, whereby sunlight can be focussed into a light guide which transmits the light to a distant point, where it is emanates from the fibre, for example to provide day-lighting within the interior of a building Large area solar energy units are expensive. The advantage that solar concentrator systems in accordance with the preferred embodiments of invention provide therefore is the ability to decrease the cost of the optical system and the size of the energy transducer unit as compared to the same overall size of photovoltaic unit.

Optical films can be made very cost effectively, since they can be produced using a reel-to-reel manufacturing process, in which wide films (e.g. up to 2 m wide) can be made at a high speed (30 meters per minute for example). Complex micro-optical structures can be reliably and accurately replicated on such films.

Therefore there are significant advantages to making solar concentrators using low cost optical films provided the result is an efficient lens—that is one which concentrates a sufficient fraction of the incident light within the desired target area. An efficient lens is generally better than 75% efficient or, if possible, better than 80%.

Cylindrical Fresnel lenses are constructed by using prismatic structures which are extended in one direction. These structures are easier to make compared to full two dimensional Fresnel lenses since a rotating drum can be cut with the prismatic pattern and the resulting drum directly used in the manufacturing process as the mould. High precision drum cutting lathe machines are available which perform this function.

In at least its preferred embodiments the inventions provides a cylindrically curved Fresnel lens arrangement. This is beneficial for two main reasons. Firstly the curve improves the efficiency of the lens as the increased reflectance from the front surface of the lens, resulting from angling that surface with respect to the incident direct solar light, is more than compensated by the reduced Fresnel losses from the prismatic features on the back of the lens. Secondly it means that for incoming light that is not orthogonal to the lens surface, interference between the two facets of preferred prismatic structures can be avoided. In other words it can be arranged that the non-functioning facet, i.e. that from which a light ray does not initially emerge, can be 'moved' out of the way of the light paths. This means that the lens can cope with some tolerance in the angle of incidence of light without significant reductions in lens efficiency. This is an important consideration in practical implementations of the lens such as in a solar concentrator.

The arrangement of prismatic features specified in accordance with the invention is particularly beneficial since it facilitates efficient manufacture using single point turning of mould drums for use in continuously moulding the optical film, e.g. with a diamond. This contrasts with contouring methods in which a cutting tool is moved in and out relative to the drum surface to form the prismatic features on the drum. Contouring would typically be used to form prismatic structures of a desired shape but generally results in blunt apices as the shape of the tool is not exactly matched to the shape of the apex. As the size of the prismatic features is reduced, the proportion of the prism that is affected by this issue increases. Therefore the resultant features must generally be relatively large relative to the tool so that the inevitable curved apex which arises with such techniques does not form a significant part of the prismatic shape, resulting in reduced efficiency for the lens.

Single point turning can be used to create very sharp prismatic features even with small feature sizes, but has the constraint that the shape of the resulting feature is fixed by the shape of the tool. This means that different tools are required to make different shapes. To form a lens arrangement where the angle of the light emerging from the surface has to increase across the lens, traditional lens design would dictate that a large number of different tools would be required, each forming different prismatic features.

It will be apparent from the foregoing however that the lens designs disclosed herein enables a significantly more efficient technique to be used for the fabrication of the moulds for efficient linear lens arrangements such as Fresnel lenses, which, due to the small feature size but preserved high lens efficiency of preferred embodiments, can be used to make continuously moulded optical film.

When viewed from a further aspect the invention provides a method of manufacturing a mould for producing a Fresnel lens optical film; said method comprising rotating a mould blank, and forming a plurality of different prismatic features on said mould blank by repeatedly advancing a cutting tool onto and then withdrawing the tool away from the surface of the mould blank.

In one set of embodiments the cutting tool is rotated between respective cuts. By rotating a single cutting tool in discrete steps relative to the axis of rotation of the disc or drum, differently shaped prismatic features but having a common apex angle can be formed. Thus it will be apparent that the prismatic features in a given segment of lens arrangements in accordance with the invention can be formed with a single tool. By using such variation and a small number of segments, only a small number of tools is required which minimises the production costs associated with having to purchase multiple tools and having to change tools during production.

In the embodiments described above the cutting tool is advanced towards and withdrawn away from the surface of the moulding blank along the same line, the rotation of the tool taking place between cuts. This results in a prism shape for each cut which matches the tool shape (rotated through different angles) and which has a sharp prism apex.

Whilst having advantages over using individual cutting tools for each prism, the single point turning technique described above does have some drawbacks however. One is the need to keep the cutting tool at a constant angle relative to the rotational axis of the mould blank during cutting to ensure that both flat prism facets are at the correct angles and that the prism apex is sufficiently sharp. However this can sometimes be hard to achieve as it requires coordination in the movement of the tool as it moves along two separate axes. Another drawback is that the tool still needs to be changed at least once in order to cut all the prisms required to make up the lens.

In a further set of embodiments the method comprises advancing the cutting tool onto and withdrawing it away from the surface of the moulding blank along different directions. This allows the apex angle of the prism which is cut to be greater than the apex angle of the tool and so allows greater variation in the prisms which can be cut with a single tool and so gives a greater ability to optimise the Fresnel lens design. This can, in some embodiments, allow all the prisms required to make a mould for producing Fresnel lenses to be cut with a single tool.

In one set of such embodiments the tool is rotated during cutting. The tool is advanced as if it were cutting only one facet of the prism, as for single point turning, in order to create the first facet. However keeping the tool tip in a fixed position relative to the mould blank, the tool is rotated until it lies at the desired angle of the second facet, and then it is either withdrawn to cut this facet or returned so that neither facet of the tool is in touch with the surface, and withdrawn.

In another set of such embodiments the tool is advanced to create the first facet and then, without rotation, the tip is withdrawn along the desired second facet. This prism sweeping cut obviates the need to ensure that the tool tip is kept in a fixed position about which the tool is rotated. Avoiding rotation of the tool about its apex also minimises the risk of damaging the tool apex.

In both sets of embodiments described above a single small tool can be used to cut small prisms with sharp apices, of varying angles. The apex angle can be varied from a minimum set by the apex angle of the tool itself up to any desired angle. In practice a tool can be chosen having an angle corresponding to (i.e. just smaller than) the smallest prism apex angle required. This allows the smallest-angle prism to be cut using single point turning and the others to be cut by advancing and withdrawing the tool along different directions. Thus a set of preferred embodiments comprises cutting a plurality of prisms in the mould blank using a single tool, at least one of said prisms having an apex angle corresponding to the apex angle of the tool.

This can be contrasted with diamond contouring which is a cruder technique that tends only to be able to produce apex angles of the order of ten times the tool apex angle. This is because diamond contouring uses only the tip of the tool to cut the prismatic features rather than using both the facets and the tip of the tool to cut the prismatic features.

The mould blank could be a flat circular disc for forming a radial lens mould, but is preferably a drum for forming a linear lens mould for the reasons given previously.

Preferably the moulding blank has a metal surface. More preferably the moulding blank has a surface made from electro-deposited copper or nickel.

In preferred embodiments the method comprises using a prism shaped tool. In preferred embodiments the method comprises using a diamond tool.

Preferably the structures the tool cuts are between 10 and 100 microns in depth. More preferably the structures the tool cuts are between 10 and 40 microns in depth. Preferably the tool tip has a curve sharper than half a micron radius.

It will be appreciated that at least some embodiments of the methods set out above allow moulds to be produced for making linear and radial Fresnel lenses which do not have the structure of the first aspect of the invention. The invention also extends to moulds made using these methods and to optical film Fresnel lenses made using such moulds.

When viewed from a further aspect the invention provides a method of manufacturing an optical film comprising passing a continuous film of transparent material over a moulding drum, said moulding drum having surface relief adapted to impart corresponding linear features to the film passing over the drum, said features having a prismatic sectional profile and being arranged to cooperate to form a lens arrangement having a linear focal axis parallel with said linear features.

The invention also extends to an optical film manufactured using the method set out above and to a linear lens arrangement such as a linear Fresnel lens made using such a film, preferably bent into a curve about an axis parallel with the focal axis.

In preferred embodiments of the invention the film of transparent material is unrolled from a reel.

In preferred embodiments of the method the film is coated with a layer e.g. a lacquer or resin, which is curable in ultraviolet light prior to passing it over the drum.

Preferably the method comprises curing the film in ultraviolet light. Preferably the curing step takes place before the film leaves the moulding drum.

The method preferably comprises the step of rolling the film onto a second reel.

In some embodiments the features imparted by the surface relief of the drum are arranged into at least two segments, wherein in each segment said prismatic features have a common apex angle, the common apex angle differing between adjacent segments. This has the benefits in terms of manufacturability of the moulding drum as set out above. However it is not essential.

Preferably the prismatic structures, either on optical films per se or on the moulds for making them, have a depth of no greater than 50 microns, preferably no greater than 30 microns. This minimises the costs of the UV curable resin which is employed in accordance with preferred embodiments, and can also assist in maximising the production rate and ensuring accurate micro-optical shape replication.

Preferably optical films in accordance with the invention are treated so as to minimise the reflection of light from the upper surface which is typically, although not essentially, free of prismatic features. This can be beneficial in increasing the transmission of light through the film, particularly if the anti-reflective property is still operative to a relatively high angle of incidence from the normal. For example with a curved film carrying a Fresnel-type lens arrangement, e.g. used in a solar concentrator, the direct sunlight striking the edge of the film does so at a high angle of incidence. A significant fraction of the sunlight would therefore otherwise be reflected from this surface. One such type of treatment is to provide raised nano-structures such as protuberances whose size is of the order of around 100 to 300 nm. The structures are less than the wavelength of visible light and effect a graded refractive index surface which reduces reflectance. Such films can retain very high optical transmission.

Preferably optical films in accordance with the invention comprise an outer surface which is hydrophobic. This allows the film to be to at least some extent self cleaning and so enable them to be kept free of dirt etc. which can impair light transmission without having to provide a transparent protective cover which would add to the cost and itself reduce overall light transmission.

One way of making the outer surface very highly hydrophobic would be to coat it with a layer of a very hydrophobic polymer, such as a fluoropolymer. Another way to achieve this is to combine a structured surface with a highly hydrophobic coating, to create a 'superhydrophobic' surface. Such surfaces have water contact angles of well over 150 degrees. Normally such structuring is achieved by a combination of microstructures (e.g. micro-protuberances) and nano-structures to create a 'lotus effect' surface. However in the present application micro-protuberances could interfere with the correct light transmission of the lens and therefore it is preferred that only nano-structures are used.

As can be appreciated from the foregoing, raised nano-structures can have both an anti-reflection and a self-cleaning effect (when combined with a highly hydrophobic coating).

Certain preferred embodiments of the present invention will now be described, by way of example only, with reference to the accompanying drawings in which.

Figure 1:
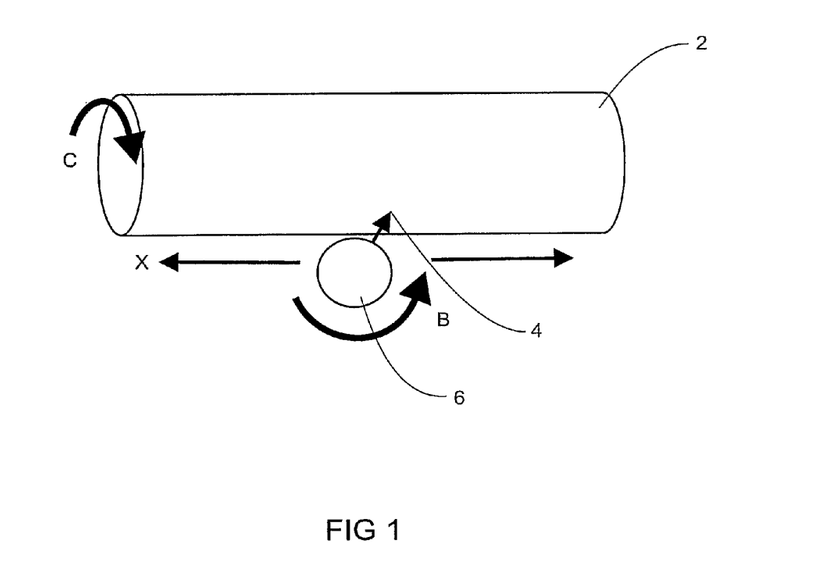
FIG. 1 is schematic view of apparatus used to cut a mould in accordance with the invention.

FIG. 1 shows, schematically, an arrangement for cutting a moulding drum 2 for use in the production of optical film in accordance with an embodiment of the invention. The drum 2 is made from a suitable metal, such as electrodeposited copper or nickel, and is mounted to rotate in a direction C around its longitudinal axis. A diamond-tipped cutting tool 4 is mounted on a carriage 6 which can be translated parallel to the axis of the drum 2 in a direction X, and which can also be rotated in a direction B about an axis parallel to a tangent to the drum. The carriage can also be advanced towards and away from the drum.

In general the point angle of the tool (and thus the internal angle of the ultimate prism formed by the mould cut using the tool) is preferably greater than around 30 degrees, so that the tool is not too long and thin and fragile. This is factored into the design of the Fresnel lens arrangement in accordance with the preferred embodiments of the invention.

Ideally, but not essentially, the cutting angle used for a given tool is set so that angle of each facet from the vertical is greater than around 3 degrees. This helps to ensure that the prism can be released from the mould during the high speed optical film manufacture process—non-shrinking optical UV curable lacquers need to be used to ensure that the cast shape closely replicates the shape of the mould and this then makes it harder to release 'difficult' structures from the mould without damaging them.

Figure 2:
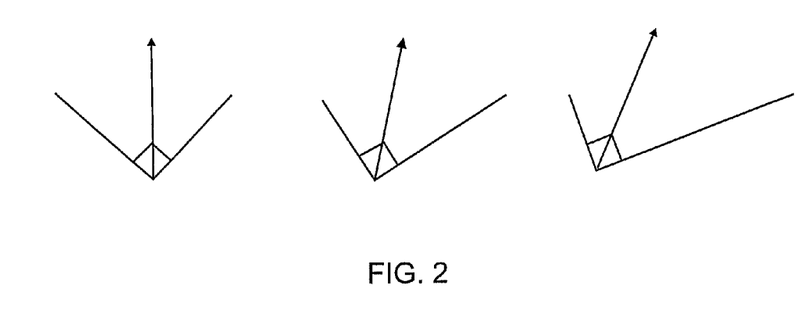
FIG. 2 is a schematic illustration of a different prism shapes that can be formed with a common apex angle.

To produce a moulding drum for producing optical films, first a suitable diamond point cutting tool 4 is mounted on the carriage 6. The drum 2 is then rotated at a suitable speed, for example around 600 revolutions per minute as indicated by the arrow 6. The cutting angle of the tool 4 is set by rotating the carriage 6 in the direction B under the control of a pre-programmed controller. The effect of altering the cutting angle of the tool can be seen in FIG. 2. This show three exemplary prism shapes which can be achieved through varying the cutting angle of a single tool.

Once the cutting angle has been set, the carriage is translated along the X axis by the controller to position the apex of the tool 4 at the desired position along the X axis. The tool 4 is then moved towards the drum 2, cutting the surface of the drum until the correct depth of the tool apex is achieved. The tool is then retracted and a new cutting angle is set by rotating about B. The carriage 6 is then moved along to a new position on the X axis and the cutting operation is repeated. This way it is seen that a part of the mould is formed which will produce a segment of the ultimate lens arrangement on the optical film in which a series of prismatic features will have a common apex angle.

Once a series of features has been cut with the first tool, the tool is changed for one that has a different apex angle. The cutting procedure outlined above is then repeated to produce another segment of the ultimate lens arrangement.

It will be appreciated that having to stop the machine to change a tool has an impact on production efficiency as well as on the cost of purchasing tools. However the lens arrangements in accordance with the preferred embodiments of the invention allow an effective lens to be produced with a minimal number of tool changes. Indeed examples of lenses in accordance with the invention have been produced with only two segments—that is to say using only two different tools.

Figure 3:
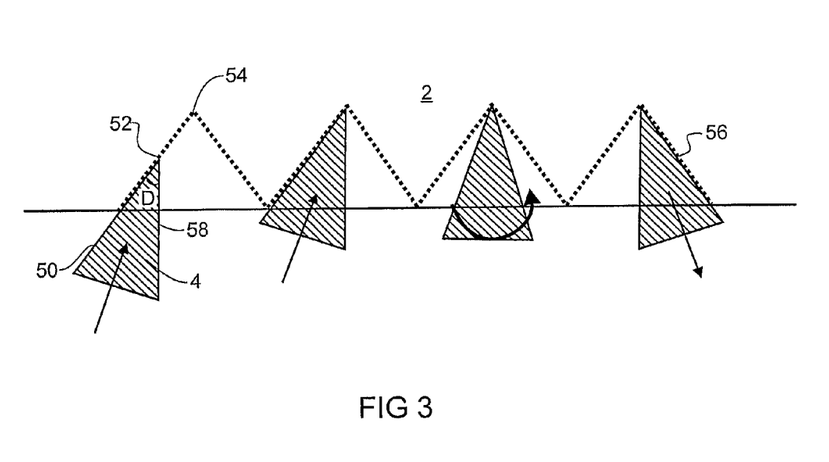
FIG. 3 is a schematic illustration of a mould cutting method in accordance with the invention.

A modification to the cutting process is shown in FIG. 3. This shows included angle tool rotation prism cutting which removes the need to change the tool 4 in the machine as a single tool 4 is able to create a number of different apex angles. The tool 4 used has an apex angle D just smaller than the tightest prism to be cut in the structure. The cutting procedure is to first position the tool 4 so that one of its facets 50 is in line with the first facet 52 to be cut. The tool 4 is then advanced into the moulding drum 2 along the direction of this facet 52 to cut the facet 52. When the point of the apex 54 of the prism to be cut is reached, the tool 4 is then stopped and rotated until it lies in the position of the other facet 56 of the prism to be cut. During rotation, by coordinating the X, Z and B axes, the tool tip is kept in the same position at the apex 54. The tool is then withdrawn from the moulding drum 2 in a direction so that the other facet 58 of the tool 4 cuts the second facet 56. Of course if the smallest-angle prism is required, no rotation of the tool is carried out; it is simply withdrawn again along the same axis.

Figure 4:
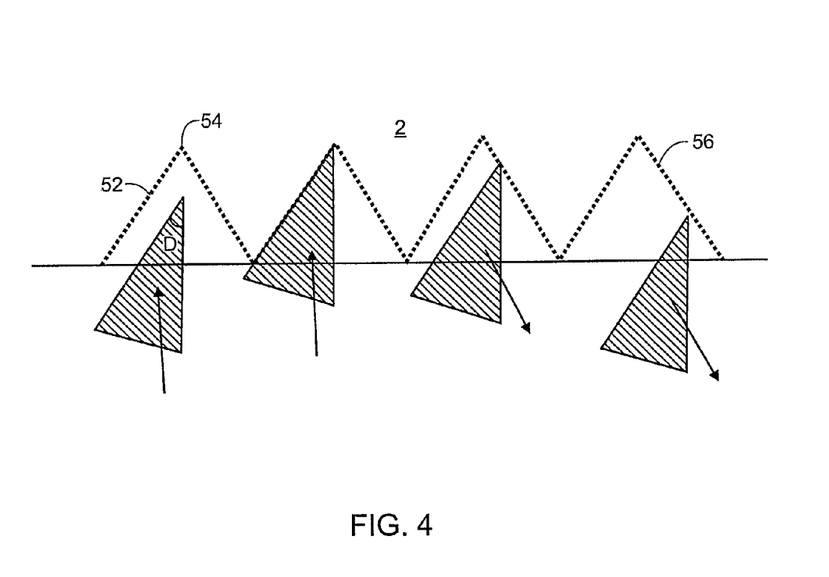
FIG. 4 is a schematic illustration of a different mould cutting method in accordance with the invention.

A further approach is shown in FIG. 4 which avoids rotating the tool 4 about its apex but still is able to use just a single tool 4, again having its apex angle D just smaller than the tightest prism to be cut in the structure. This shows cutting by prism sweeping which first advances the tool 4 into the moulding drum 2 to cut the first facet 52 of the prism. When the point of the apex 54 of the prism to be cut is reached, the tool 4 is then stopped and withdrawn (without rotation) from the moulding drum 2 along the direction of the second facet 56 so that the tip of the tool 4 cuts this facet 56.

The result of the foregoing processes is a drum shaped mould for use in the process of manufacturing surface relief optical films, the surface of the drum being inscribed with the inverse of the necessary micro-optical structures.

The optical film is produced as follows. First a base film such as polyethylene terephthalate (PET), polyethylene naphthalate (PEN), ETFE, acrylic or a similar optically transparent polymer film, is coated with a UV curable lacquer, which is itself highly transparent and which cures to a material with a known refractive index An example of a suitable resin is Rad-Kote X-6JA-68-A which is commercially available from Rad-Cure Corporation, 9 Audrey Place, Fairfield, N.J. 07004. This lacquer has been formulated to cure through visible light and its viscosity is 500 cP.

The coated film is impressed onto the drum, with the coating side face on to the drum. In this way the coating is forced into the inverse features of the mould. At this point a UV light is used partially or completely to cure the coating, thus making it take up the form of the inverse of the mould. The resulting film is pulled of the drum resulting in a base film on whose surface are the desired micro-optical features. This is implemented as a continuous process which can manufacture optical film at high production rates, for example 15 meters per minute.

Once a very low cost, high efficiency linear Fresnel lens film is available a number of important systems can be constructed, which can for example operate to provide renewable energy in the form of electricity, hydrogen production or heat generated by the systems configured as a utility system; or provide renewable energy in the form of electricity, hydrogen production or heat generated by the systems configured in the form of building integrated systems, which also operate to remove direct solar heating from the incoming light (thereby reducing energy demands on the building cooling systems) and still enabling the illumination of interiors with the diffuse daylight The following illustration show an exemplary implementation as a solar concentrator, though those skilled in the art will be able to design further similar systems.

Figure 5:
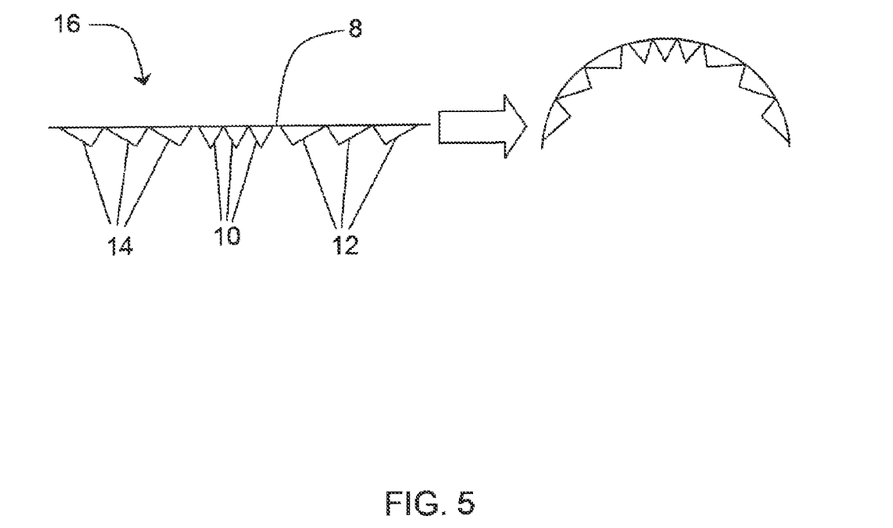
FIG. 5 is a schematic illustration of the formation of a linear curved Fresnel lens.

The continuous film produced as set out above is shown schematically in FIG. 5 and comprises a film surface 8 with prismatic leans features 10, 12, 14 relieved from its surface. The central prism 10 has a different apex angle to the two outer prisms 12, 14. The two outer prisms 12, 14 have the same apex angle and can be formed with the same tool, but are different (mirror image) shapes. The film is cut into strips which are then curved to form cylindrically curved Fresnel lens arrangements. as shown on the right hand side of FIG. 5 and the central upper portion of FIG. 6. This is beneficial firstly because the curve gives an extra refractive effect. However it also enables interference between the two facets of the prisms to be avoided as will be explained in greater detail below with reference to FIGS. 7 to 10.

Figure 6:
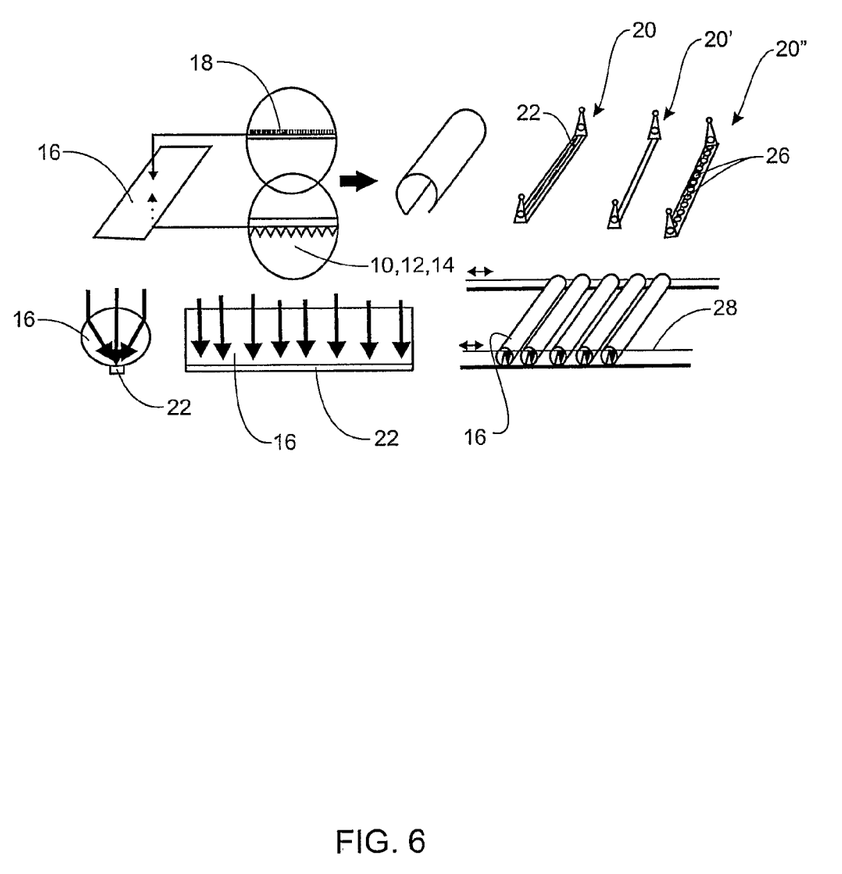
FIGS. 6a to d are schematic illustrations of the construction of a solar concentrator in accordance with the invention.

As is shown schematically in the upper left part of FIG. 6, the film strip 16 has the prismatic features 10, 12, 14 on the lower surface (which becomes the inner surface when the film is rolled) but on the outer surface there are formed nano-protuberances 18 which are of the order of 100-300 nanometers in scale. There is also a hydrophobic fluoropolymer coating (not shown). Between then these give the film 16 both anti-reflection and self-cleaning properties.

The strips of film 16 are rolled into (near) cylinders and are fitted to mountings 20, 20', 20" three examples of which are shown in the upper right part of FIG. 6. Along the elongate base of the first mounting 20 is a strip of photovoltaic material which acts as a transducer for converting light into electrical energy. As can be seen from the schematic illustration in the bottom left part of FIG. 6, the lens 16 acts to focus the light into an elongate focal axis located at the transducer 22 which maximises the amount of electrical energy which is produced.

The second mounting alternative 20' differs in that the energy transducer is arranged as a tube 24, for example containing a working fluid which is heated up and then used for solar heating or to drive a high efficiency turbine generator, such as a Stirling engine.

The third mounting alternative 20" has a line of discrete photovoltaic cells 26 along the focal axis.

The assemblies of mounted film rolls 16 and energy transducer strips 22, 26 can be rotated by using a single driven cylinder with motorised rotation and sun pointing sensor (not shown), which is linked by rods 28 to the other cylinders 16 so as to rotate them together.

The lenses could be mounted behind glass, but because of the self-cleaning film on the outer surface of the film, they can equally be left exposed—e.g. in a similar manner to sun blinds in a building-integrated window arrangement in an office, conservatory or greenhouse. Such solar modules can also be mounted in buildings, for example replacing louvre blinds. Direct sunlight is removed, thereby reducing the heat load on the building and can be used to generate electricity, hydrogen or heat (or a combination). Indirect sunlight enters the room (and may be, for example, further diffused with other optical films).

As mentioned above, the provision of a lens arrangement comprising prismatic features arranged in segments having a common apex angle; and the use of a curved linear Fresnel-type lens both contribute to be able to ensure that the non-optically functional prism facet is kept well away from the light travelling through the prismatic structure and exiting from the prism structure. This will now be explained in greater detail with reference to FIGS. 7 to 10.

Figure 7:
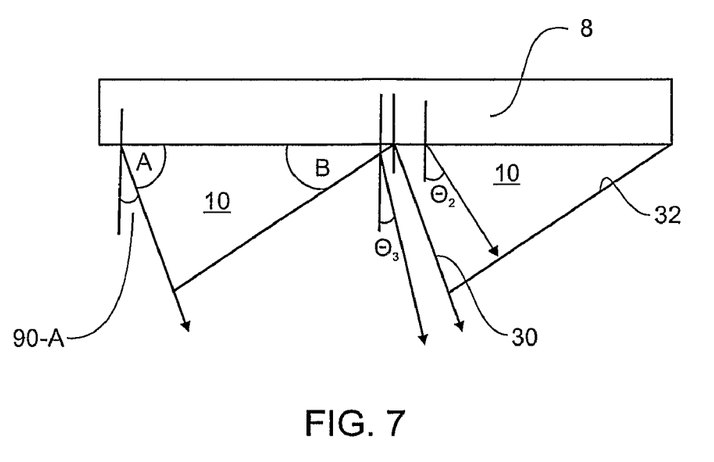
FIG. 7 is a schematic illustration of the ideal angle condition for a Fresnel lens.

With reference initially to FIG. 7, there are shown two adjacent identical prismatic features 10. Each has two facets: an alpha facet 30 which makes an angle A to the surface 8 of the film; and a beta facet 32 which makes an angle B to the surface 8 of the film. To avoid a detrimental effect on the operation of the lens the light passing through the film must only interact with one facet of the prism—the beta facet 30 which is used to redirect the light to intersect the target. The other, alpha facet 32 does not operate optically and only serves the function of 'flattening' the lens into a Fresnel lens.

Figure 8:
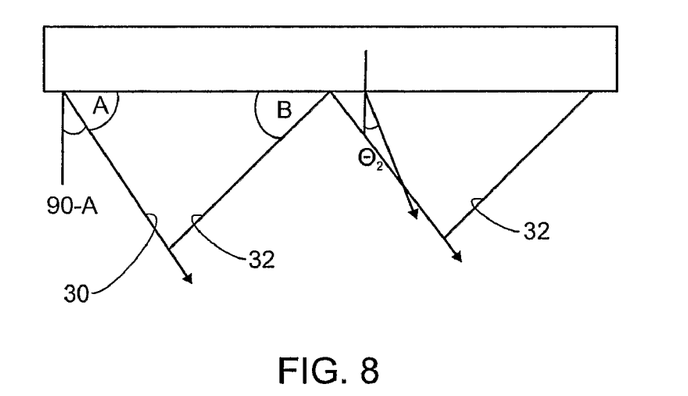
FIG. 8 is a schematic illustration similar to FIG. 7 showing a sub-optimal angle condition.
Figure 9:
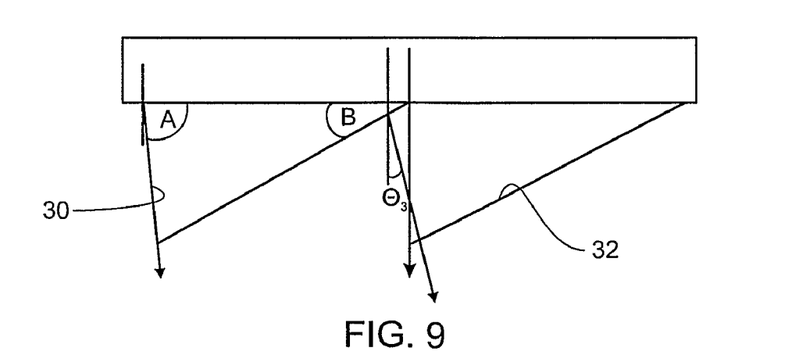
FIG. 9 is a schematic illustration similar to FIG. 7 showing another sub-optimal angle condition.
Figure 10:
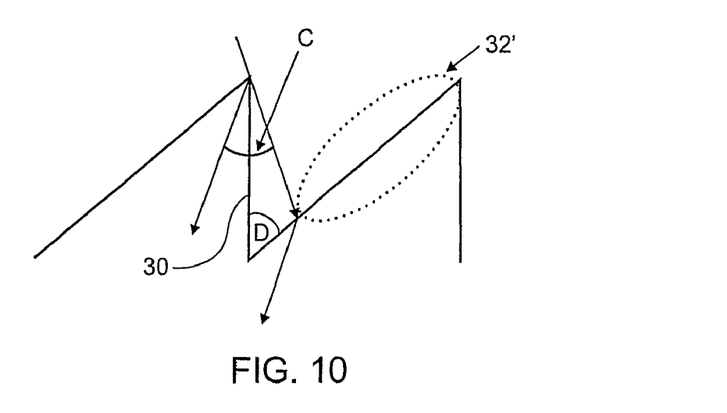
FIG. 10 is a further schematic illustration of how preferred embodiments can avoid the prism apex.

Two possible sets of light rays might intersect the alpha facet 30: the light travelling through the prism 10, at angle $\theta_2$; and light which has traveled through and been refracted by an adjacent prism 10 towards the target being refracted by the prism, at angle $\theta_3$. These two situations are shown in FIGS. 8 and 9 respectively.

In order that the alpha facet 30 avoids the first of the light paths then for a prism of a given shape it is necessary that there is a single value of angle A such that:

$$\theta_3 < (90 \text{ degrees} - A) < \theta_2.$$

In other words the angle the alpha facet 30 makes to the normal to the film surface 8 must lie between $\theta_2$ and $\theta_3$.

This is the situation shown in FIG. 7.

Clearly if 90-A were greater than $\theta_2$ then light travelling through the prism would intersect the alpha facet 30 as illustrated in FIG. 8. Similarly if 90-A were less than $\theta_3$ then light exiting the prism would intersect the left hand ('alpha') facet.

It follows that for this condition to be met then $\theta_3$ must be less than or equal to $\theta_2$ in order to 'squeeze' a correct alpha facet angle between these values. The extreme, where $\theta_3 = \theta_2$, only occurs if the beta facet 32 is normal to the light ray travelling within the prism so that no refraction takes place. In that case the design would need to keep the beta facet 32 normal to the ray within the prism as any deviation of the ray within the prism would result in some light interacting with the alpha facet 30. Therefore such a design would have no tolerance in the angle of incidence and any deviation of the prism from the correct orientation would result in some shadowing. This is inevitable in most practical contexts. For example the accuracy of solar trackers is typically around 2 degrees.

If the angle of the prism is less than 90 degrees, then an angle difference is created between the ray within the prism and the refracted emerging ray, which enables the alpha facet 30 to lie between these angles (and therefore to be clear of the two rays). In addition it gives a range of acceptable incident angles for segments of constant prism apex angle.

Finally, by having an angle difference C between the alpha facet angle A and the ray travelling within the prism 10, all the light within the prism avoids the prism apex D, which, in a practical embodiment, could be rounded/degraded compared to the accuracy of the facets away from the prism apex. This is demonstrated in FIG. 10 where it can be seen that only the encircled section 32' of the beta facet is utilised. Consequently an angle A of the alpha facet 30 which fits approximately in the middle of this angle difference is preferred.

The following table illustrates the prism angle for different values of the difference in angles between the ray within the prism and the emerging ray, taking the refractive index of the prism material to be 1.53 (these angles will be different for materials with a different refractive index).

| Angle difference (degrees) | Prism apex angle (degrees) |
| --- | --- |
| 0 | 90 |
| 1 | 87.607 |
| 2 | 85.226 |
| 4 | 80.515 |
| 6 | 75.924 |
| 8 | 71.502 |
| 10 | 67.288 |

As the angle difference is increased so that the angle the ray within the prism makes with the beta surface 32 increases, the Fresnel reflectance of the back surface also increases and overall transmittance of the prism goes down. It is therefore desirable to set the angle difference at a suitable compromise between a large value which maximises the range of acceptable angles of incidence; and a small value which maximises transmittance. Experiments have shown that an angle difference of 6 degrees or less in probably optimal. The preferred minimum prism interior angle is thus 75 degrees or more. A lens can be constructed from a series of such constant apex angle segments, with the angle difference increasing in segments across the lens.

The final angle constraint is that the beta facet 32 must actually refract light so it must be less than the critical angle, i.e. the angle $\theta_2$ that the ray within the prism makes with the beta facet 32 must be less than $\theta_{crit}$ which is given by:

$$\theta_{crit} = \arcsin\left(\frac{n_2}{n_1}\right)$$

where $n_2$ is the refractive index of the prism material and $n_1$ is the refractive index of air.

Therefore for $n_2$=1.53 and $n_1$=1.004, the critical angle is 40.863 degrees.

An example lens design in accordance with the invention is shown in FIG. 9. Here the lens material has a refractive index of 1.53.

The central part of the shape 34 is left clear of prisms to the width of the target 36. A an inner prism segment 38 is provided on either side of the non-prism section 34. The prisms in this segment 38 have a near right-angle apex e.g. 87.61 degrees giving a 2 degree deflection. The curve of the film, that is the angle of the film's surface with respect to the incident solar light, is such that at a 2 degree deflection, the deflected light is strikes the far left edge of the target 36. The second, outer segment of the lens 40 is formed from prisms with an apex angle of 80.51 degrees which gives a 4 degree angle deflection which allows for a an alignment accuracy of +/−2 degrees. Thus the curved film with inner prismatic surface results in the deflection of light which focuses the collimated sunlight hitting it onto a linear strip at the target 36. Within each segment 38, 40 the prismatic apex angle remain constant but the prism is rotated within each segment to give the lens effect.

Figure 11:
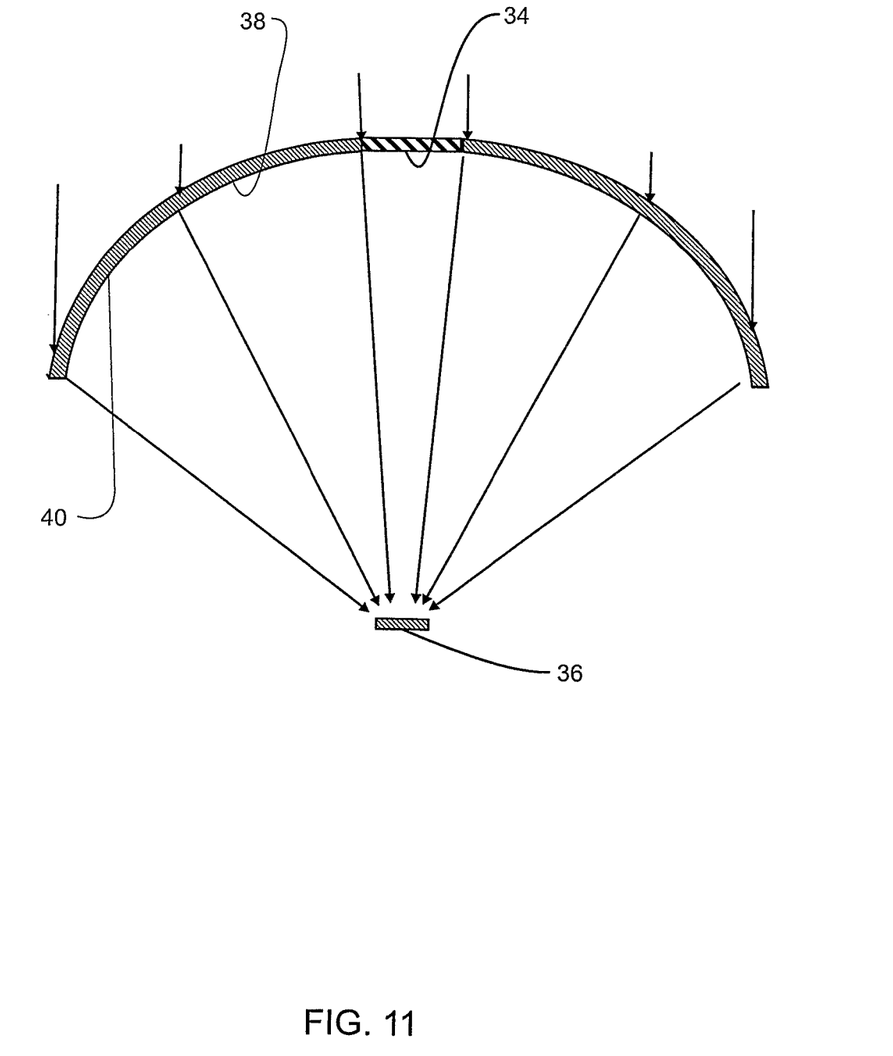
FIG. 11 is a schematic representation of a curved linear lens embodying the invention.
Figure 12:
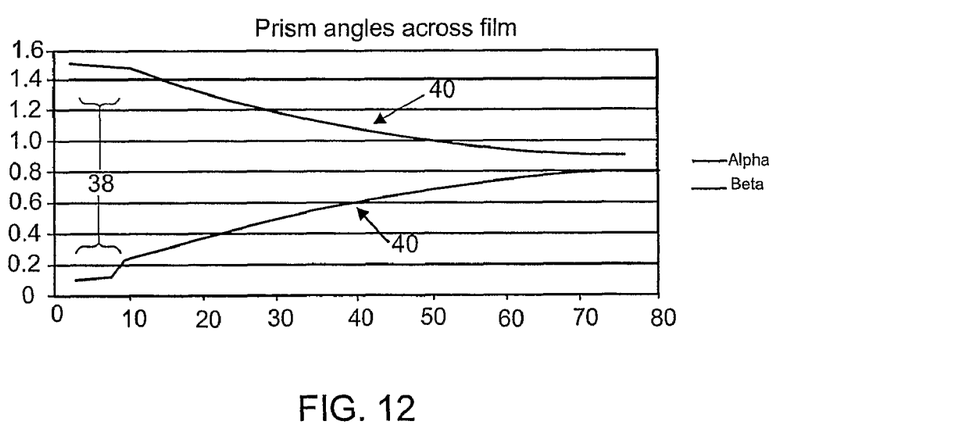
FIG. 12 is a graph of example prism facet angles across the width of a film in accordance with the invention.

FIG. 12 is a graph of the angles of the alpha and beta facets to the normal (upper and lower plots respectively) which are created as the cutting angle of the tool and the interior angle of the tool are changed in moving across the right half of the film from the centre (left side of the graph) to the edge (right side of the graph). The first section 34 (no prisms, see FIG. 11) is left out and therefore two segments are clear: the first segment 38 has the fixed 87.61 degree interior angle corresponding to the tool being rotated a little across this narrow section; the other segment 40 has the fixed 80.51 interior angle but the facet angles change across the film as the tool cutting the drum that produced it was rotated. It can be seen that only a single tool change is required in cutting the surface of the moulding drum for producing this film. The alpha and beta facet angles to the normal are of course related trigonometrically by the fixed interior angle pertaining to each tool and thus each segment.

Figure 13:
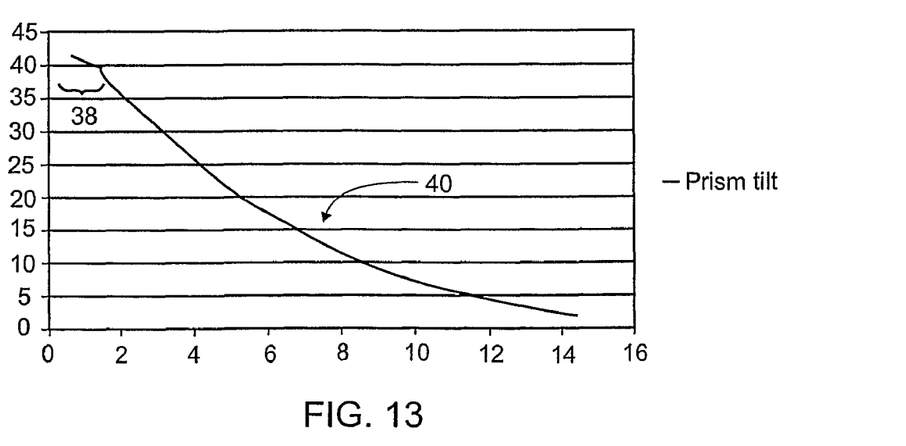
FIG. 13 is graph of the variation of the prism axis angle corresponding to the facet angles of FIG. 12.

FIG. 13 also shows the effect of rotation of the prism tools across the film, this time by plotting the angle of the central axis of the tool. As can be seen, the angle of the tool is varied across each segment to give the varying 'alpha' and 'beta' facet angles shown in FIG. 12.

It will be appreciated by those skilled in the art that many variations and modifications to the described embodiments are within the scope of the invention. For example, using the techniques described with reference to FIGS. 3 and 4 allows optical films to be produced which do not have segments with a common apex angle, if such is required. Indeed they can also be applied to produce disc-moulds for point lenses.

The invention claimed is:

1. A solar concentrator comprising a curved linear Fresnel lens including a plurality of prismatic features, said prismatic features being arranged into at least two segments, wherein the prismatic features in each segment all have a common apex angle, the common apex angle differing between adjacent segments.

2. A solar concentrator as claimed in claim 1, wherein the curved linear Fresnel lens is cylindrical.

3. A method of manufacturing a mould for producing a Fresnel lens optical film said method comprising rotating a mould blank, and forming a plurality of different prismatic features on said mould blank by repeatedly advancing a cutting tool onto and then withdrawing the tool away from a surface of the mould blank, wherein said prismatic features are arranged so that the mould is able to produce an optical film comprising a plurality of prismatic features together forming a Fresnel lens when the film is curved, said prismatic features being arranged into at least two segments, wherein the prismatic features in each segment all have a common apex angle, the common apex angle differing between adjacent segments.

4. A mould manufactured using the method of claim 3.

5. An optical film Fresnel lens manufactured using the mould of claim 4.

6. An optical concentrator film comprising a plurality of prismatic features together forming a lens arrangement when the film is curved, said prismatic features being arranged into at least two segments, wherein the prismatic features in each segment all have a common apex angle, the common apex angle differing between adjacent segments.

7. An optical concentrator film as claimed in claim 6, wherein the prismatic features are adapted to form a lens arrangement when the film is curved.

8. An optical concentrator film as claimed in claim 6, wherein the lens arrangement is cylindrical when the film is curved.

9. An optical film comprising a plurality of prismatic features together forming a Fresnel lens when the film is curved, said prismatic features being arranged into at least two segments, wherein the prismatic features in each segment all have a common apex angle, the common apex angle differing between adjacent segments.

10. An optical film as claimed in claim 9, wherein the Fresnel lens is cylindrical when the film is curved.

11. An optical film as claimed in claim 9, wherein the prismatic features have a depth of no greater than 50 microns.

12. An optical film as claimed in claim 9, comprising an outer surface, wherein the film is treated so as to minimize the reflection of light from the outer surface.

13. An optical film as claimed in claim 12, wherein the film is treated by providing raised nano-structures.

14. An optical film as claimed in claim 9, comprising an outer surface which is hydrophobic.

15. An optical film as claimed in claim 14, wherein the outer surface is structured consisting only of nano-structures.

16. A method of manufacturing an optical film as claimed in claim 9, the method comprising passing a continuous film of transparent material over a moulding drum, said moulding drum having surface relief adapted to impart corresponding linear features to the film passing over the drum, said features having a prismatic sectional profile and being arranged to cooperate to form a lens arrangement having a linear focal axis parallel with said linear features.

17. A method of manufacturing an optical film as claimed in claim 16, comprising coating the film with a layer which is curable in ultraviolet light prior to passing the film over the drum.

18. A method of manufacturing an optical film as claimed in claim 16, wherein the features imparted by the surface relief of the drum are arranged into at least two segments, and wherein in each segment said features have a common apex angle, the common apex angle differing between adjacent segments.

19. A method of manufacturing an optical film as claimed in claim 16, wherein the features have a depth of no greater than 50 microns.

20. A method of manufacturing an optical film as claimed in claim 16, comprising unrolling the film of transparent material from a first reel.

21. A method of manufacturing an optical film as claimed in claim 20, comprising rolling the film onto a second reel.

22. An optical film manufactured using the method of claim 16.

23. A linear lens manufactured using the optical film of claim 22.

24. A linear lens as claimed in claim 23, wherein the optical film is bent into a curve about an axis parallel with the focal axis.

25. A method of manufacturing an optical film as claimed in claim 16, comprising curing the film in ultraviolet light.

26. A method of manufacturing an optical film as claimed in claim 25, wherein the curing step takes place before the film leaves the moulding drum.

27. A method as claimed in claim 16, comprising treating the film so as to minimize reflection of light from an outer surface of the film.

28. A method as claimed in claim 27, comprising treating the film by providing raised nano-structures.

29. A method as claimed in claim 27, comprising applying a hydrophobic coating to the outer surface.

30. A method as claimed in claim 27, comprising treating the outer surface to render the outer surface hydrophobic.

31. A method as claimed in claim 30, comprising providing a structured outer surface consisting only of nano-structures.

* * * * *